United States Patent
Kaistha et al.

(10) Patent No.: US 12,401,349 B2
(45) Date of Patent: Aug. 26, 2025

(54) SINGLE EVENT UPSET HARDENED FLIP-FLOP AND METHODS OF OPERATION

(71) Applicant: NXP B.V., Eindhoven (NL)

(72) Inventors: Rishabh Kaistha, Nangal (IN); Akhil Garg, Greater Noida (IN); Kunal Singh Sengar, Bikaner (IN)

(73) Assignee: NXP B.V., Eindhoven (NL)

( * ) Notice: Subject to any disclaimer, the term of this patent is extended or adjusted under 35 U.S.C. 154(b) by 43 days.

(21) Appl. No.: 18/341,988

(22) Filed: Jun. 27, 2023

(65) Prior Publication Data
US 2024/0372539 A1    Nov. 7, 2024

(30) Foreign Application Priority Data
May 5, 2023    (IN) .............................. 202341032186

(51) Int. Cl.
| H03K 3/037 | (2006.01) |
| H03K 19/003 | (2006.01) |
| H03K 19/21 | (2006.01) |

(52) U.S. Cl.
CPC ......... *H03K 3/0375* (2013.01); *H03K 3/0372* (2013.01); *H03K 19/00338* (2013.01); *H03K 19/21* (2013.01)

(58) Field of Classification Search
None
See application file for complete search history.

(56) References Cited

U.S. PATENT DOCUMENTS

| | | | | |
|---|---|---|---|---|
| 7,523,371 B2* | 4/2009 | Mitra | ............. | G01R 31/318525 714/729 |
| 7,653,850 B2* | 1/2010 | Tschanz | ................. | G06F 11/24 714/699 |
| 7,795,927 B2* | 9/2010 | Farwell | ............. | H03K 19/0033 327/263 |
| 7,859,292 B1* | 12/2010 | Shuler, Jr. | .......... | H03K 19/0033 326/46 |
| 8,255,748 B2* | 8/2012 | Moyer | ............. | G01R 31/31816 714/724 |
| 8,324,951 B1* | 12/2012 | Zarkesh-Ha | ......... | H03K 3/0375 327/206 |
| 8,402,328 B2* | 3/2013 | Wang | .................... | G06F 30/327 714/799 |
| 8,581,652 B2* | 11/2013 | Kobayashi | ........... | H03K 3/3562 327/202 |

(Continued)

FOREIGN PATENT DOCUMENTS

WO    2022076099 A1    4/2022

OTHER PUBLICATIONS

Julai et al., "Error Detection and Correction of Single Event Upset (SEU) Tolerant Latch," 2012 IEEE 18th International On-Line Testing Symposium (IOLTS), Jun. 27-29, 2012, 6 pages.

(Continued)

*Primary Examiner* — Thomas J. Hiltunen

(57) ABSTRACT

A single event upset (SEU) hardened flip-flop comprises a master latch and a plurality of slave latches, where an output of the master latch is coupled to a respective input of the slave latches. A Muller element which has an input which is coupled to a respective output of the slave latches and an output which is coupled to a bus keeper. The bus keeper maintains a logic level output in presence of the SEU.

19 Claims, 4 Drawing Sheets

(56) References Cited

U.S. PATENT DOCUMENTS

| | | |
|---|---|---|
| 8,841,952 B1 | 9/2014 | Singh et al. |
| 9,559,671 B1 * | 1/2017 | Jagannathan ...... H03K 3/35625 |
| 10,613,926 B2 | 4/2020 | Schat |
| 11,949,413 B2 * | 4/2024 | Nakanishi .......... H03K 19/0075 |
| 12,095,464 B2 * | 9/2024 | Chiang ................ H03K 3/3562 |
| 2010/0052756 A1 * | 3/2010 | Tang ...................... H03K 3/012 |
| | | 327/202 |
| 2015/0067425 A1 | 3/2015 | Kim |
| 2023/0055458 A1 * | 2/2023 | Maillard ................. G06F 30/30 |

OTHER PUBLICATIONS

Nathan D Hindman et al: "High speed redundant self-correcting circuits for radiation hardened by design logic", Radiation and Its Effects on Components and Systems (RADECS), 2009 European Conference On, IEEE, Sep. 14, 2009, pp. 465-472.

* cited by examiner

SINGLE EVENT UPSET HARDENED FLIP-FLOP AND METHODS OF OPERATION

CROSS-REFERENCE TO RELATED APPLICATIONS

This application claims the priority under 35 U.S.C. § 119 of India patent application No. 202341032186, filed on 5 May 2023, the contents of which are incorporated by reference herein.

FIELD OF USE

This disclosure generally relates to a flip-flop, and more particularly to a flip-flop which is hardened to reduce errors resulting from a single event upset (SEU).

BACKGROUND

In a single event upset (SEU), an ionizing particle strikes a latch to cause it to change a logic level output from a logic level 1 to logic level 0 or vice versa. The changed level introduces an error which is generally referred to as a soft error. The soft error does not permanently affect operation of the latch, but could lead to a safety issue because the latch might output a logic level which is now in error to a system and cause the system to malfunction. One solution to add redundancy to the latch and reduce risk of the safety issue is to use triple voting flops (TVF). The triple voting flops (i.e., latches) include two additional flops initially set to output a same logic level as a flop and a majority voting is implemented to detect a correct logic level in presence of the soft error. TVF reduces a device's failure in time (FIT) rate and improves system reliability. Other solutions include using shadow registers or implementing lockstep cores to create additional redundancy to minimize any errors associated with the SEU.

Figure 1:
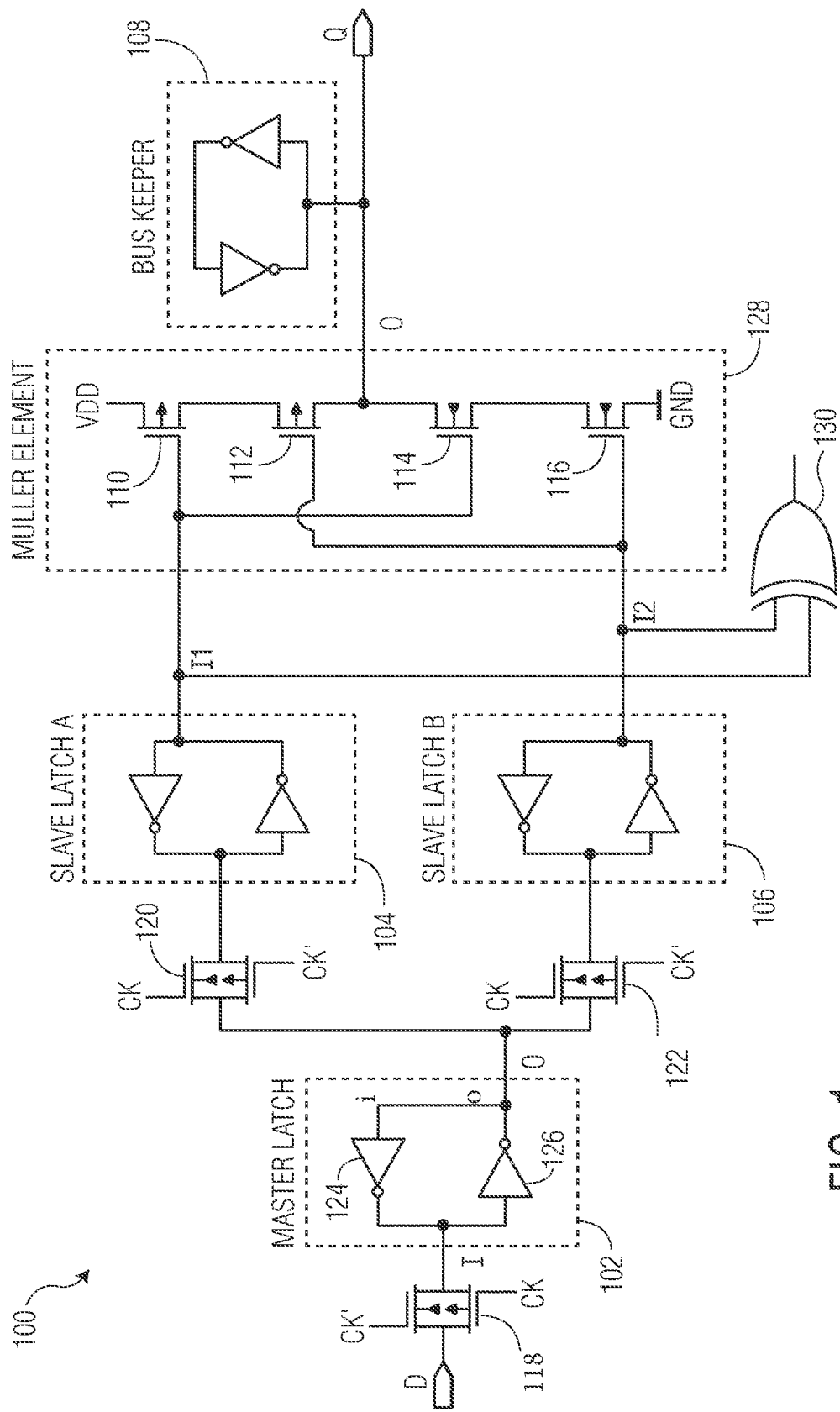
FIG. 1 illustrates a circuit diagram of a single event upset (SEU) hardened flip-flop in accordance with an embodiment.

The drawings are for the purpose of illustrating example embodiments, but it is understood that the embodiments are not limited to the arrangements and instrumentality shown in the drawings.

DETAILED DESCRIPTION

The detailed description of the appended drawings is intended as a description of the various embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

A flip-flop is a logic circuit which stores a logic level such as a logic level value 0 or logic level value 1. The flip-flop includes two flops (i.e. latches) which are coupled together.

A single event upset (SEU) occurs when an ionizing particle strikes the flip-flop and causes it to change a logic level stored by the flip flop.

Embodiments disclosed herein are directed to a flip flop which is hardened to single event upset (SEU) events to avoid errors because of the SEU events. The disclosed flip flop has master latch coupled to a replicated slave latch which stores and outputs a logic level input to the master latch. The master latch and slave latches drives a Muller element coupled to a bus keeper which maintains a logic level of the Muller element, but in the case of the SEU events, a logic level output by the slave latches do not match and the Muller element produces a tri-stated output. The tri-state causes the bus keeper coupled to the Muller element to maintain the logic level prior to the SEU in presence of the SEU. The flip-flop also outputs an error signal which is used to safe-state a system in which the flip-flop is implemented so that the system does not cause a safety issue.

Example Systems

FIG. 1 illustrates a circuit diagram of a single event upset (SEU) hardened flip-flop 100 in accordance with an embodiment. The flip-flop 100 is composed of a plurality of latches 102-106. A latch is a digital circuit typically implemented by transistors. The latch has an input I and an output O and comprises in an example two inverters 124-126 coupled together, where an output "o" of one inverter is coupled to an input "i" of another inverter in a back-to-back configuration. A logic level applied to the input I of the latch causes the latch to output an inverse of the logic level at the output O and at the same time preserves the logic level at the input when the input is removed. The logic level may be a logic level "0" or "1" indicative of a voltage maintained by the latch and this operation is referred to herein as "latching" the input.

In an example, the latch 102 of the flip flop 100 is a master latch which is coupled to the latches 104, 106 which are slave latches. The two slave latches 104, 106 are coupled to an output of the master latch 102. Further, an output of each of the slave latches 104, 106 is coupled to an input of a Muller element 128. The Muller element 128 is a logic circuit with two inputs $I_1$, $I_2$ and an output O which outputs a "0" when a logic level value at all inputs are "1", a "1" when a logic level value at all inputs are "0", and outputs a tri-state otherwise. An output of the Muller element 128 may be coupled to a bus keeper 108 which is a latch which receives a logic level of the output of the Muller element 128.

The master latch 102 and slave latch 104, 106 may output a logic level. In an example, the master latch 102 may receive at its input from a D (data) input of the flip-flop 100 a logic level such as a "0" or "1". In an example, an input of the master latch 102 and slave latches 104, 106 may be coupled to a plurality of gating circuits 118-122 which control when a logic level is provided to an input of the master latch 102 or slave latches 104, 106 based on a clock signal. The gating circuit is typically implemented by coupling a respective drain and source of a N-channel metal-oxide semiconductor (NMOS) transistor and P-channel metal-oxide semiconductor (PMOS) transistor together and driving the respective gates of the transistors by a clock signal CK or inverse of the clock signal CK'. Based on a first transition of a clock signal (e.g., negative edge of clock signal where clock transitions from logic level "1" to logic level "0"), the logic level at the D input of the flip-flop 100 may be provided to the input of the master latch 102 by the gating circuit 118. The master latch 102 may change its output based on the logic level at the input. If the logic level at the input is a "0" then the master latch 102 may output a logic level "1". If the logic level at the input is a "1" then the master latch 102 may output a logic level "0". Based on a second transition of the clock signal (e.g., positive edge of clock signal where clock transitions from logic level "0" to logic level "1"), the gating circuit 120, 122 may provide the output of the master latch 102 to the input of the corresponding slave latches 104, 106. The slave latch 104, 106 may change its output based on the logic level at the input. If the logic level at the input is a "0" then the slave latch 104, 106 may output a logic level "1". If the logic level at the input is a "1" then the slave latch 104, 106 may output a logic level "0". In an example, the logic level at the output of the slave latch 104, 106 is the same as the logic level at the input of the master latch 102 to store this input by latches 102-106 which form a flip-flop and the gating circuit 118, 120, 122 control a timing of when the output of the master latch 102 is provided to the input of the slave latches 104, 106

If an ionizing particle strikes one of the slave latches 104, 106 resulting in flipping of the logic level output by a slave latch, the logic levels output by the two slave latches mismatch. The Muller element 128 may perform a self-correction if this occurs. The Muller element may output a logic level of "1" when all inputs to the Muller element 128 are "0". Likewise the Muller element may output a logic level of "0" when all its inputs to the Muller element 128 are "1". All other input combinations will result in the Muller element 128 connected to the slaves latches 104, 106 outputting a tri-state to the bus keeper 108.

The Muller element 128 may comprise two PMOS transistors 110, 112 and two NMOS transistors 114, 116 in an example. In the Muller element 128, a source of the PMOS 110 may be coupled to Vdd (logic level 1) and a drain of the NMOS 116 may be coupled to ground (logic level 0). Further, a drain of PMOS 110 may be coupled to a source of the PMOS 112, a drain of the PMOS 112 may be coupled to a source of the NMOS 114, a drain of NMOS 114 may be coupled to a source of NMOS 116. A gate of PMOS 110 and NMOS 114 may be coupled to the output of the slave latch 104 and a gate of the NMOS 116 and PMOS 112 may be coupled to the slave latch 106. In an example, when an output of both of the slave latches 104, 106 are logic level "0", then the NMOS are not conducting and the PMOS are conducting which results in a logic level 1 output by the Muller element 128. In an example, when an output of both of the slave latches are logic level "1", then the NMOS are conducting and the PMOS are not conducting which results in a logic level 0 output by the Muller element 128. In an example, when an SEU occurs an output of one of the slave latches may flip a logic level value output. For example, the SEU may result in a mismatch such as logic level "1" and logic level "0" or vice versa at the output of the slave latches resulting from an SEU. In this example, the output of the slave latches may cause only one of the NMOS to be conducting and only one of the PMOS to be not conducting or vice versa which results in a tri-state output which is a high-impedance state and the output of the Muller element 128 is disconnected from the bus keeper 108. Because the output is tri-stated, the bus keeper 108 which receives the output of the Muller element 128 may maintain a value of the slave latch before the SEU to self-correct a spurious bit flip of the slave latch 104, 106.

In an example, an XOR circuit 130 which performs a logic exclusive OR function may be coupled to the output of the slave latches 104, 106 and if the output of the XOR gate 130 is logic level "1" then SEU has occurred while if the output of the XOR gate 130 is logic level "0" then an SEU has not occurred. The output of the XOR gate 130 may be coupled to safe-state circuitry which places a system having the flip-flop 100 in a safe state so that the system may safely function in presence of the SEU. In an example, the system may be in an automobile with the safe-state circuitry and the presence of the SEU may cause the automobile to operate in a mode which poses a reduced risk of further malfunction of the automobile and increased safety of occupants.

The SEU is described in the above examples as affecting the latches 102-106. In some examples, the SEU may affect the bus keeper 108 rather than the latches 102-106. If the SEU does not affect the logic output by the latches 102-106, then a logic state of the bus keeper 108 may not change as a result of the SEU. The bus keeper 108 may maintain its logic level in accordance with the logic level output by the Muller element 128. In this way, the bus keeper 108 is also hardened against the SEU.

In an example, an SEU to the output of the master latch 102 may cause an error in the flip-flop 100. To reduce chances of such an error, the master latch 102 may be duplicated and coupled to a Muller element similar to the arrangement of the slave latches. Alternatively, a duty cycle that the master latch 102 is outputting a logic level which is to be latched to the slaves 104, 106 may be reduced and/or the clock signal may be punctured to cause the output of the master latch 102 to be latched to the slave latch 104 to minimize chances that the SEU will affect the logic level of the master latch 102 before being latched by the slave latches 104, 106.

In an example, components of the hardened flip-flop 100 might not be implemented on a single integrated circuit. Instead, the hardened flip-flop 100 may be implemented as distributed components which are coupled together, e.g., the bus keeper 108 may be placed on a logical net which is also coupled to an output of the Muller element 128 to provide communication there-between and increase a safe distance between components so that they cannot be simultaneously impacted by the SEU. In this example, the logical net may include a metal or wire with sufficient length to provide the separation between the bus keeper 108 and Muller element 128 and facilitate the communication.

Advantageously, the flip flop 100 provides an area efficient approach towards the spurious logic level flips compared to conventional hardening of flip flops such as triple voting flops (TVF) by introducing minimal additional hardware or using redundant lockstep cores, reducing a failure in time (FIT) rate significantly. The use of TVF as an example to harden against SEU may require 68 transistors compared to the flip-flop 100 which could be implemented with 36 transistors in an example. The flip flop 100 remains operational during the SEU compared using redundant lockstep cores to protect against the SEU or replacing flops in a core with TVF which both require significant additional circuitry.

To validate operation of the flip flop 100, an ionizing particle hitting a register/latch output, causing an SEU, and then leading to a toggle in the logic level output by a slave latch 104, 106 may be emulated. The emulation comprises injecting current at one of the slave latch 104, 106 or the bus keeper 108 to evaluate the actual events that will happen during the SEU.

Figure 2A:
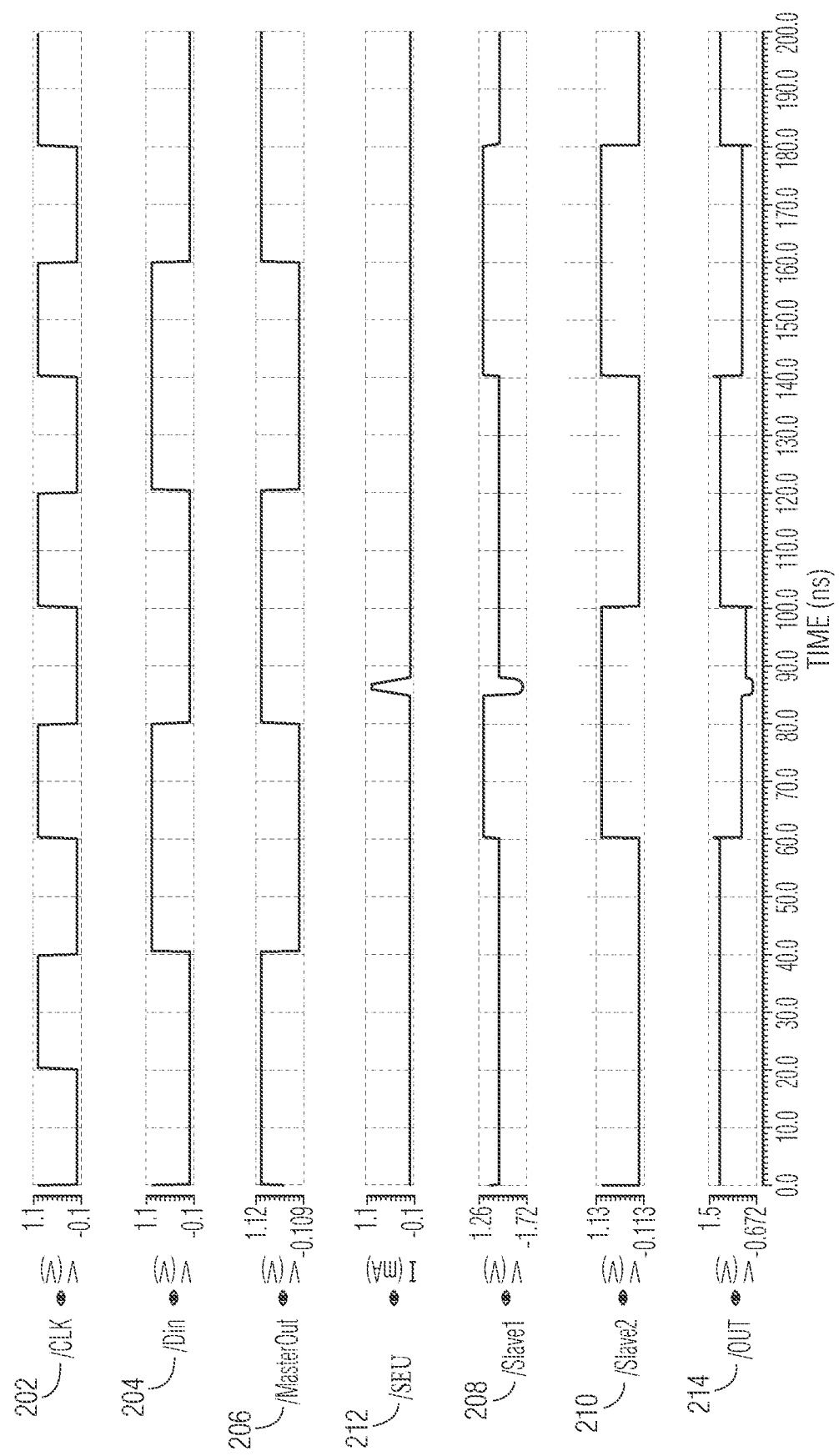
FIGS. 2A-B illustrate example waveforms associated with operation of the flip-flop in presence of the SEU in accordance with an embodiment.
Figure 2B:
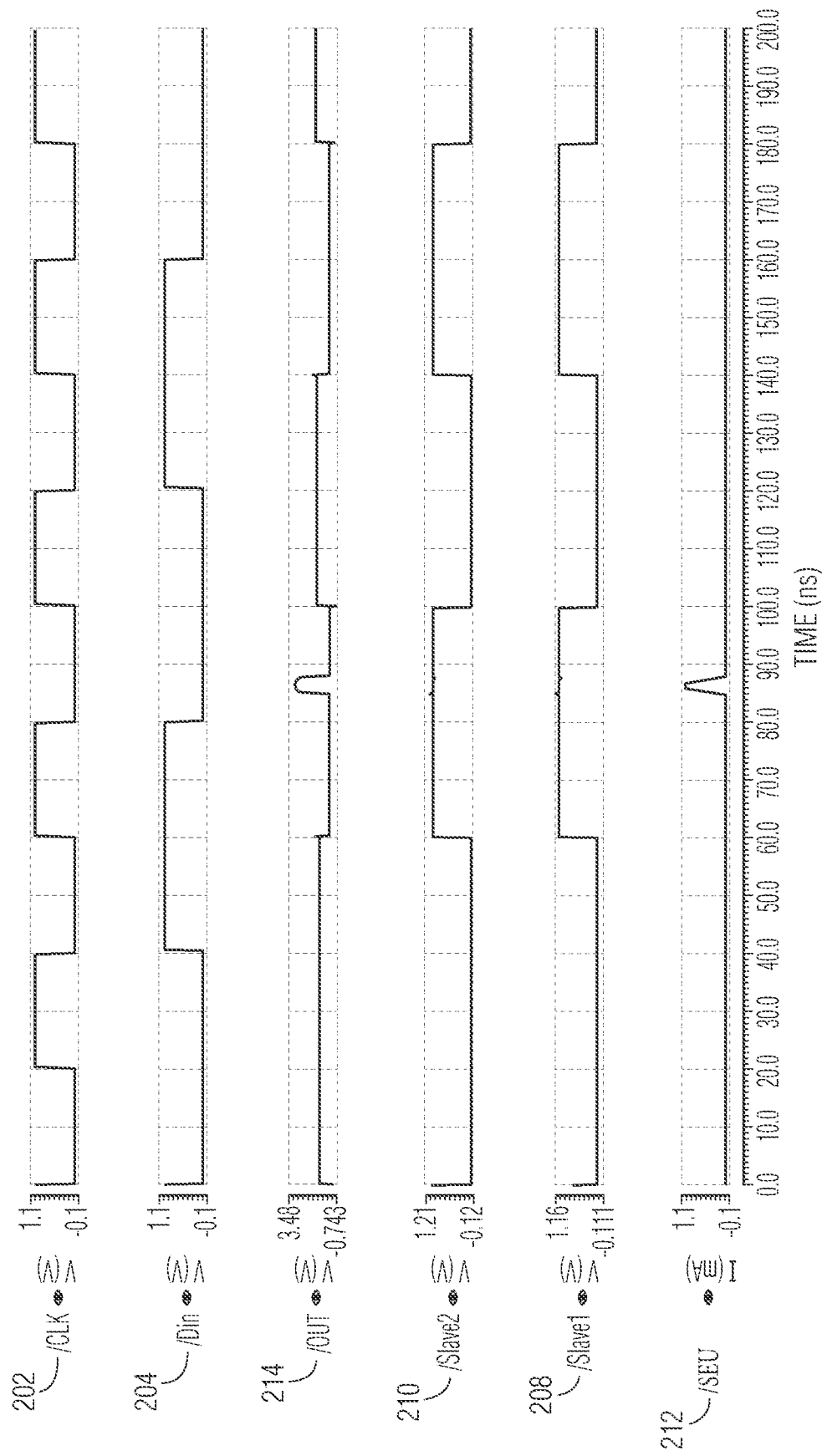

FIGS. 2A-B illustrate example waveforms 200 associated with operation of the flip-flop in presence of the SEU in accordance with an embodiment. The waveforms illustrated include the clock signal CK 202, design input signal Din 204 to the master latch 102, master latch output 206, slave_latch_1 104 output 208, slave_latch_2 106 output 210, and the bus keeper 108 output 214. Further, the waveforms illustrate a current injection I 212 which is timed in accordance with the clock signal to simulate an SEU and evaluate hardening of the flip-flop 100. In an example, a current of 1 mA is injected at one of the slave latches 104, 106 or the bus keeper 108 to emulate the SEU.

FIG. 2A illustrates waveforms when the design input signal Din 204 is a logic level "0" and the current 212 is injected during a negative level of the clock CLK 202 (i.e., logic level "0") to the slave latch 104. The design input Din 204 may be asserted or deasserted as a function of time. The master latch 206 may latch the design input Din 204 on a negative edge of the CLK 202 and the master latch output 206 may output an inverse of the logic level of the design input Din. The slave latches 104, 106 may latch the logic level of the master latch output 206 on the positive edge of the clock CLK 202 and the slave latches 104, 106 may output an inverse of the logic level of the master latch output 206 as slave_latch_output 206, 208. The fault which is caused by current injection I 212 during the negative level of the clock CLK 202 to the slave latch 104 causes a change in the slave_latch_output 208. The bus keeper 108 output 214 continues to output a logic level "0" which is not affected by the SEU. The behavior of the flip-flop 100 may be similar when a fault is injected during one or more of a positive level of the clock CLK 202 and design input Din 204 is a logic level "0", a positive level of the clock CLK 202 (i.e., logic level "1") and design input Din 204 is a logic level "1", or a negative level of the clock CLK 202 and design input Din 204 is a logic level "1".

FIG. 2B illustrates waveforms when the bus keeper 108 output 214 is a logic level "0" and a fault is injected to the bus keeper 108. The design input Din 204 may be asserted or deasserted as a function of time. The master latch 206 may latch the design input Din 204 on a negative edge of the CLK 202 and the master latch output may output an inverse of the logic level of the design input Din. The slave latches 104, 106 may latch the logic level of the master latch output 206 on the positive edge of the clock CLK 202 and the slave latches 104, 106 may output an inverse of the logic level of the master latch output as slave latch outputs 208, 210. The fault which is caused by current injection I 212 during the negative level of the clock CLK 202 to the bus keeper 108 causes a change in the bus keeper 108 output 214, but the bus keeper output 214 continues to output a logic level "0" which is not affected by the SEU based on the drive by the Muller element 128. The behavior of the flip-flop 100 may be similar when a fault is injected during a positive level of the bus keeper 108.

Example Methods

Figure 3:
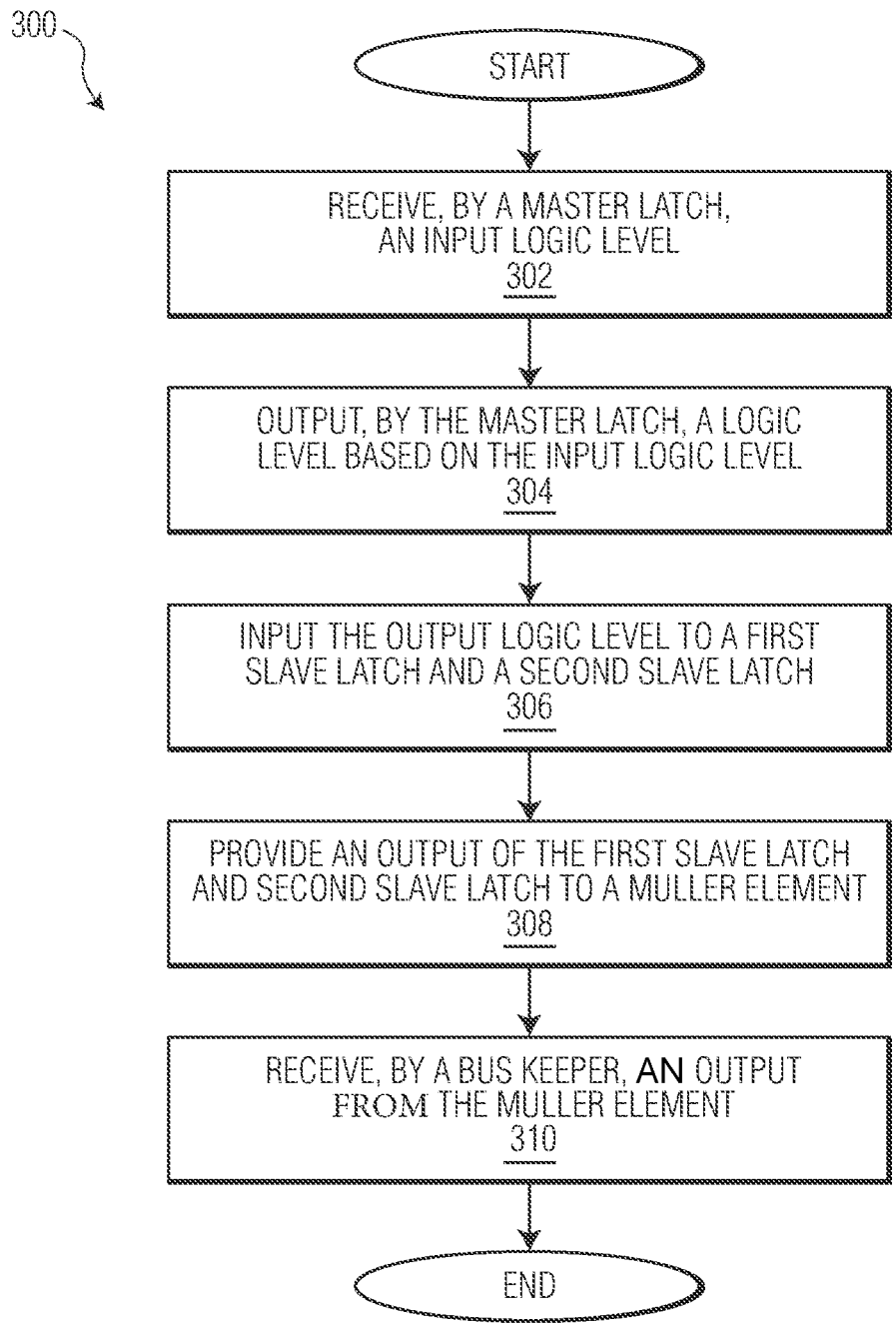
FIG. 3 is a flow chart of example functions associated with operation of the flip-flop in accordance with an embodiment.

FIG. 3 is a flow chart 300 of example functions associated with operation of the flip-flop in accordance with an embodiment. In an example the functions may be performed by the flip-flop 100. At 302, an input logic level is received at a master latch of a flip-flop. In an example, the input logic level is received at the master latch at a first logic level transition of a clock such as a negative edge transition of the clock. At 304, the master latch outputs a logic level based on the input logic level. At 306, the output logic level is input to a first slave latch and a second slave latch. In an example, the input logic level is received at the slave latches at a second logic level transition of the clock such as a positive edge transition of the clock. At 308, an output of the first slave latch and second slave latch is provided to a Muller element. The Muller element outputs a logic level "0" or logic "1" when the output logic level of the slave latches 104, 106 are the same and tri-states an output when the output of the slave latches are different which results from an SEU. At 310, a bus keeper receives an output from the Muller element. The output may be a logic level or tri-state. The logic level which is kept by the bus keeper may be "0" or "1" and not changed by the tri-state such that the flip-flop 100 is self-correcting in presence of an SEU.

In an embodiment, a method is disclosed. The method comprises: receiving an input logic level at a master latch of a flip-flop at a first logic level transition of a clock; outputting by the master latch a logic level based on the input logic level; inputting the output logic level to a first slave latch and a second slave latch at a second logic level transition of the clock; and providing output logic levels of the first slave latch and second slave latch to a Muller element coupled to a bus keeper, wherein the Muller element outputs to the bus keeper a first logic level or second logic level when the output logic levels of the slave latches are the same and outputs a tri-state when the output logic levels of the slave latches are different which results from a single event upset (SEU), wherein a first logic level or second logic level output by the bus keeper does not change in presence of the SEU. In an example, the method further comprises outputting by the Muller element the first logic level based on a first same logic level output of the slave latches, outputting by the Muller element the second logic level based on a second same logic level output of the slave latches, and outputting by the Muller element a tri-state level based on the logic level outputs of the slave latches being different. In an example, the method further comprises storing by the bus keeper the first logic level or second logic level in presence of the tri-state output by the Muller element. In an example, the method further comprises gating the input logic level at the first logic level transition of the clock and gating the output logic level to the first slave latch and second slave latch at the second logic level transition of the clock. In an example, the method further comprises providing an indication of whether the output logic levels of the slave latches are different based on the SEU. In an example, the method further comprises transitioning a system having the flip-flop into a safe state based on the indication.

In another embodiment, a single event upset (SEU) hardened flip-flop is disclosed. The flip-flop comprises a master latch; a plurality of slave latches, wherein an output of the master latch is coupled to a respective input of the slave latches; a Muller element, wherein an input of the Muller element is coupled to a respective output of the slave latches; and a bus keeper which is coupled to an output of the Muller element. In an example, the master latch, the slave latch, and the bus keeper comprise each two logic gates, wherein an output of one logic gate is coupled to an output of another logic gate. In an example, the logic gate is selected from a group consisting of an inverter and an AND gate. In an example, the Muller element comprises a plurality of PMOS and a plurality of NMOS. In an example, an output of the first slave latch is coupled to a gate of a first NMOS and first PMOS and an output of the second slave latch is coupled to a gate of a second NMOS and second PMOS. In an example, a source of the first PMOS is coupled to Vdd and a drain of the first NMOS is coupled to ground. In an example, a drain of the second PMOS and a source of the second NMOS are coupled to the bus keeper. In an example, the flip-flop further comprises a gating circuit coupled to a clock which is arranged at an input of the master latch. In an example, the flip-flop further comprises a gating circuit coupled to a clock which is arranged at the respective input of each slave latch. In an example, the output of the Muller element is a tri-state when a logic level output by the first slave latch and second slave latch are not equal. In an example, the logic level output is selected from a group consisting of a logic level "1" and a logic level "0". In an example, the flip-flop further comprises an exclusive OR gate (XOR) coupled to the respective output of the slave latches, wherein the XOR outputs an indication of whether the first slave latch and second slave latch experienced the SEU. In an example, the flip flop is in an safety critical device and an output of the XOR is coupled to safe state circuitry of the safety critical device to cause the safety critical device to enter into a safe state. In an example, the safety critical device is an automobile.

A few implementations have been described in detail above, and various modifications are possible. The disclosed subject matter, including the functional operations described in this specification, can be implemented in electronic circuit, computer hardware, firmware, software, or in combinations of them, such as the structural means disclosed in this specification and structural equivalents thereof: including potentially a program operable to cause one or more data processing apparatus such as a processor to perform the operations described (such as a program encoded in a non-transitory computer-readable medium, which can be a memory device, a storage device, a machine-readable storage substrate, or other physical, machine readable medium, or a combination of one or more of them).

While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

Other implementations fall within the scope of the following claims.

We claim:

1. A method comprising:
receiving an input logic level at a master latch of a flip-flop at a first logic level transition of a clock, the master latch having only one latch;
outputting by the master latch a logic level based on the input logic level;
inputting the output logic level to a first slave latch and a second slave latch at a second logic level transition of the clock; and
providing output logic levels of the first slave latch and second slave latch to a Muller element coupled to a bus keeper, wherein the Muller element outputs to the bus keeper a first logic level or second logic level when the output logic levels of the slave latches are the same and outputs a tri-state when the output logic levels of the slave latches are different which results from a single event upset (SEU), wherein a first logic level or second logic level output by the bus keeper does not change in presence of the SEU, wherein the bus keeper and Muller element are separated by a distance that both the bus keeper and Muller element are not impacted by the SEU and a duty cycle that the one master latch outputs the logic signal to the slave latches is selected to minimize effect of the SEU on the logic signal before being latched by the slave latches.

2. The method of claim 1, further comprising outputting by the Muller element the first logic level based on a first same logic level output of the slave latches, outputting by the Muller element the second logic level based on a second same logic level output of the slave latches, and outputting by the Muller element a tri-state level based on the logic level outputs of the slave latches being different.

3. The method of claim 1, further comprising storing by the bus keeper the first logic level or second logic level in presence of the tri-state output by the Muller element.

4. The method of claim 1, further comprising gating the input logic level at the first logic level transition of the clock and gating the output logic level to the first slave latch and second slave latch at the second logic level transition of the clock.

5. The method of claim 1, further comprising providing an indication of whether the output logic levels of the slave latches are different based on the SEU.

6. The method of claim 5, further comprising transitioning a system having the flip-flop into a safe state based on the indication.

7. A single event upset (SEU) hardened flip-flop comprising:
a master latch, the master latch having only one latch;
a plurality of slave latches, wherein an output of the one master latch is coupled to a respective input of the slave latches;
a Muller element, wherein an input of the Muller element is coupled to a respective output of the slave latches; and
a bus keeper which is coupled to an output of the Muller element, wherein the bus keeper and Muller element are separated by a distance that both the bus keeper and Muller element are not impacted by the SEU and a duty cycle that the one master latch outputs the logic signal to the slave latches is selected to minimize effect of the SEU on the logic signal before being latched by the slave latches.

8. The flip-flop of claim 7, wherein the master latch, the slave latch, and the bus keeper comprise each two logic gates, wherein an output of one logic gate is coupled to an output of another logic gate.

9. The flip-flop of claim 7, wherein the Muller element comprises a plurality of PMOS and a plurality of NMOS.

10. The flip-flop of claim 9, wherein an output of the first slave latch is coupled to a gate of a first NMOS and first PMOS and an output of the second slave latch is coupled to a gate of a second NMOS and second PMOS.

11. The flip-flop of claim 10, wherein a source of the first PMOS is coupled to Vdd and a drain of the first NMOS is coupled to ground.

12. The flip-flop of claim 10, wherein a drain of the second PMOS and a source of the second NMOS are coupled to the bus keeper.

13. The flip-flop of claim 7, further comprising a gating circuit coupled to a clock which is arranged at an input of the master latch.

14. The flip-flop of claim 7, further comprising a gating circuit coupled to a clock which is arranged at the respective input of each slave latch.

15. The flip-flop of claim 7, wherein the output of the Muller element is a tri-state when a logic level output by the first slave latch and second slave latch are not equal.

16. The flip-flop of claim 7, wherein the logic level output is selected from a group consisting of a logic level "1" and a logic level "0".

17. The flip-flop of claim 7, further comprising an exclusive OR gate (XOR) coupled to the respective output of the slave latches, wherein the XOR outputs an indication of whether the first slave latch and second slave latch experienced the SEU.

18. The flip-flop of claim 17, wherein the flip flop is in an safety critical device and an output of the XOR is coupled to safe state circuitry of the safety critical device to cause the safety critical device to enter into a safe state.

19. The flip-flop of claim 18, wherein the safety critical device is an automobile.

* * * * *